US 6,740,806 B2

(12) United States Patent
Starer et al.

(10) Patent No.: US 6,740,806 B2
(45) Date of Patent: May 25, 2004

(54) COMBINED THERMOCOUPLE AND THERMOPILE CAPABLE OF GENERATING MULTIPLE EMF SIGNALS

(76) Inventors: Edward Starer, 110-20 71st Ave., Forest Hills, NY (US) 11375; George William Kraus, II, 5650 Great Northern Blvd. Apt. C1, North Olmsted, OH (US) 44070

( * ) Notice: Subject to any disclaimer, the term of this patent is extended or adjusted under 35 U.S.C. 154(b) by 100 days.

(21) Appl. No.: 09/849,118

(22) Filed: May 5, 2001

(65) Prior Publication Data

US 2002/0179136 A1 Dec. 5, 2002

(51) Int. Cl.[7] .......................... H01L 35/28; H01L 35/32; H01H 85/02
(52) U.S. Cl. ...................... 136/227; 136/220; 136/224; 136/208; 136/206; 136/203; 136/217; 136/225; 136/230; 136/232
(58) Field of Search ................................. 136/220, 224, 136/208, 206, 203, 227, 217, 225, 230, 232

(56) References Cited

U.S. PATENT DOCUMENTS

| | | | | |
|---|---|---|---|---|
| 2,987,566 A | * | 6/1961 | Ray ........................... 136/225 |
| 3,879,229 A | * | 4/1975 | Gilbert ........................ 136/208 |
| 4,056,406 A | * | 11/1977 | Markman et al. ........... 136/208 |
| 4,092,177 A | * | 5/1978 | Ray ........................... 136/220 |
| 5,229,612 A | * | 7/1993 | Pompei et al. .............. 250/349 |
| 2002/0153036 A1 | * | 10/2002 | Starer ......................... 136/225 |

* cited by examiner

Primary Examiner—Alan Diamond

(57) ABSTRACT

A combined thermocouple and thermopile capable of producing multiple EMF signals. The combined thermocouple and thermopile construction is particularly adapted for use as an electric generator capable of producing multiple EMF signals and able to respond faster to changes to the presence or absence of a pilot or gas burner flame. The conductors of the thermopile are comprised of dissimilar metals joined at each end to form hot and cold thermocouple junctions. The thermopile may provide multiple EMF signals when a third wire lead is affixed to a cold junction between either end of the array. The array of thermocouples is formed in a circle and enclosed in a metal sleeve or jacket. A thermocouple assembly comprised of a standard ferric chrome, nickel chrome or inconel tip; an insulated constantan wire longitudinally centered within and permanently connected to the tip; an insulated copper extension wire permanently affixed to the constantan wire and an insulated copper wire permanently affixed to the outside of the tip; is longitudinally centered within and isolated from the thermopile array contained within a metallic sleeve. The tip of the thermocouple is positioned near but isolated from the thermopile array and metallic sleeve to prevent thermal conductance through the sleeve.

5 Claims, 3 Drawing Sheets

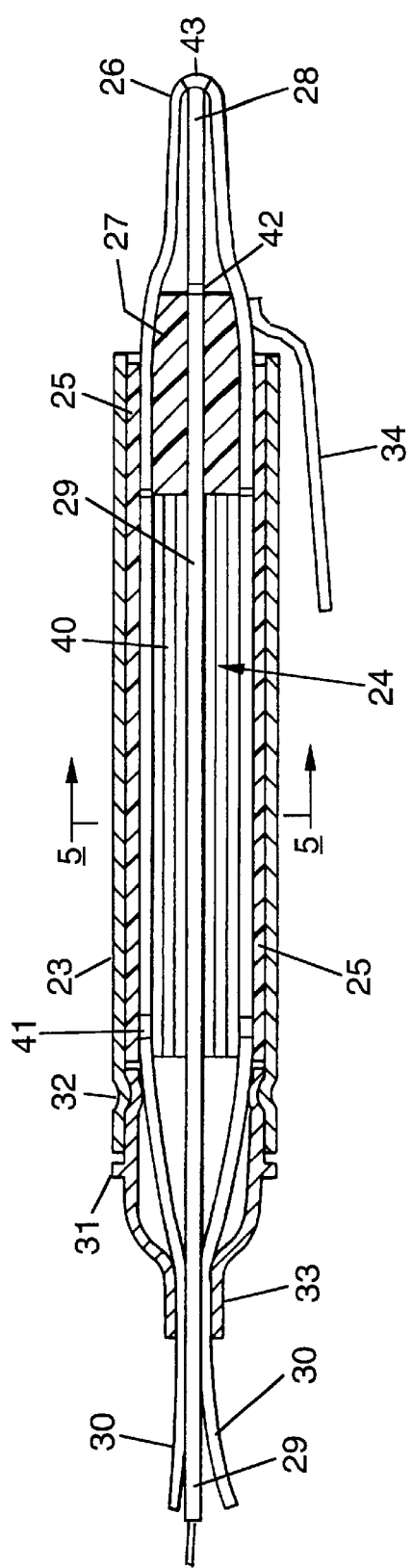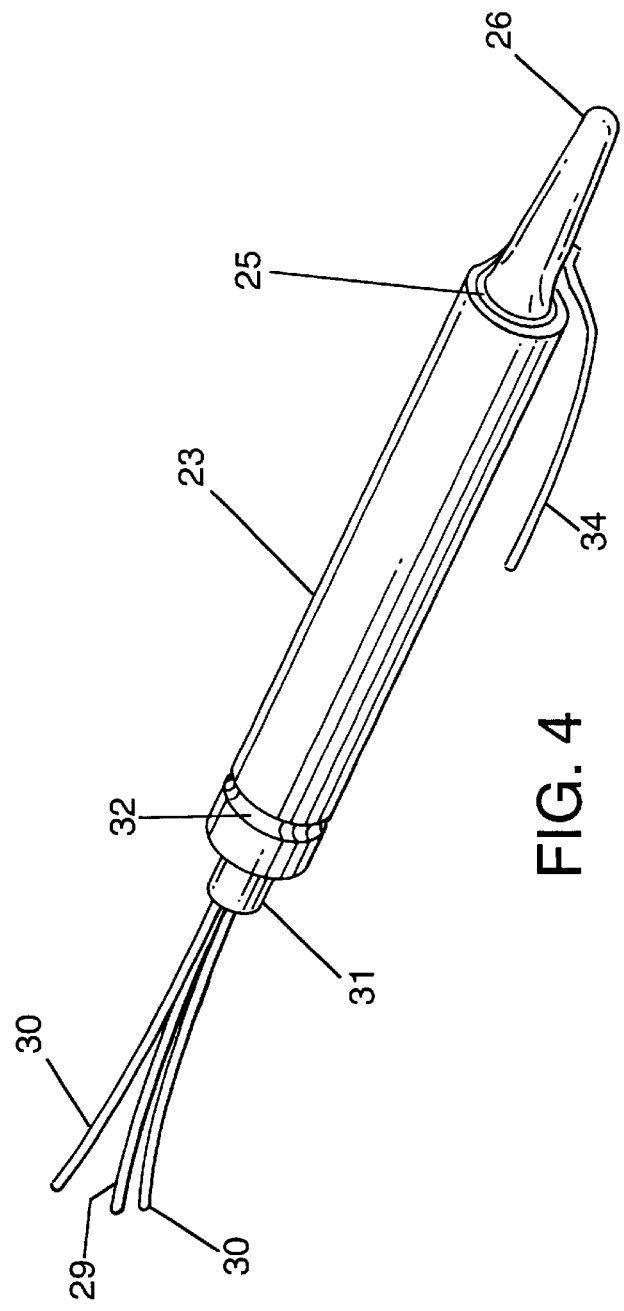

COMBINED THERMOCOUPLE AND THERMOPILE CAPABLE OF GENERATING MULTIPLE EMF SIGNALS

BACKGROUND OF THE INVENTION

Gas fired room heaters and decorative gas fireplace logs are in use in commercial and residential applications in large numbers. Many of these appliances are remotely controlled. These remotely controlled appliances utilize thermocouples and thermopiles to generate singular EMF signals to energize safety devices and activate remote control circuitry. A pilot flame or burner flame in contact with the thermocouple and thermopile generates the EMF signals required by each device via the Peltier heating and cooling effect. Typically at least one thermopile and one thermocouple are mounted to a pilot bracket or gas burner. Newer controls require more than one thermopile mounted to the pilot bracket or gas burner. As the number of EMF generators required to operate the number of control devices increases so does the physical size of the pilot assembly or gas burner bracket. Likewise, as the thermopile device grows in physical size in order to generate an EMF signal sufficient to activate the control devices so does the amount of energy required to generate a flame substantial enough to heat the generators. In addition as the mass of the thermopile increases so does the length of time required to generate the required EMF signal or to dissipate heat fast enough to deactivate the safety control devices connected to them creating potentially hazardous conditions.

The primary object of this invention is to provide a combined thermocouple and thermopile EMF generator capable of producing multiple EMF signals in one unit.

A further object is to provide an improved space factor, that is to provide a smaller pilot or burner gas bracket with a combined thermocouple and thermopile that is capable of generating multiple EMF signals.

A further object is to minimize the number of thermopiles necessary to supply the required EMF signals by utilizing one thermopile to generate primarily two signals although more signals may be generated.

A further object of this invention is to provide multiple EMF signals from one device.

A further object is to provide an improved response time by isolating the combined thermocouple of lesser mass from the thermopile of greater mass.

A further object is to provide a thermocouple and thermopile construction wherein a thermocouple of a construction commonly know to the industry is longitudinally centered within a thermopile of commonly know construction.

A further object is to provide a thermopile and thermocouple construction wherein the conductors of the thermopile are comprised of dissimilar metals joined at each end to form hot and cold junctions, arrayed in a circle and enclosed in a metal sleeve or jacket; and a thermocouple assembly comprised of a standard ferric chrome, nickel chrome or inconel tip; a constantan wire longitudinally centered within and permanently connected to the tip and an insulated copper wire permanently affixed to the outside of the tip. The thermocouple assembly being longitudinally centered within and isolated from the metallic sleeve and thermopile array contained within a metallic sleeve.

A further object of the invention is to provide a thermopile construction wherein wire extension leads connected to cold junctions at each single metal strip at either end of the array provide one EMF signal and one wire extension connected to a cold junction at an intermediate position providing a second EMF signal are arrayed in a circle and enclosed in a metal sleeve or jacket. A thermocouple assembly longitudinally centered within and isolated from the thermopile array contained within a metallic sleeve or jacket adds an EMF of lesser potential thus providing a total of three EMF signals from the combined thermocouple and thermopile.

Yet another object of this invention is to provide such a combined thermocouple and thermopile that is easy to manufacture, sturdy in use, and easy to assemble.

Other objects and advantages and features of this invention will become apparent from the following detailed description and annexed drawings.

SUMMARY OF THE INVENTION

In accordance with the principles of this invention, the above objects are accomplished by providing a combined thermocouple and thermopile as summarized in the abstract. A thermopile comprised of dissimilar metals joined at each end to form hot and cold junctions are arrayed in a circle and enclosed in a metal sleeve or jacket. The thermocouple array of which the thermopile is comprised, is capable of delivering at least two EMF signals. A thermocouple constructed of a tip, a constantan wire and a copper wire lead which is centrally located within the thermopile assembly, with the tip located at the hot junction end and isolated from the metallic sleeve and thermopile array. The combined thermocouple and thermopile provides at least three EMF signals, occupies less space and improves response time when in the presence or absence of a flame.

BRIEF DESCRIPTION OF THE DRAWINGS

FIG. 3 is an enlarged view of a section of the combined thermocouple and thermopile.

FIG. 4 is an isometric view of a preferred form of combined thermocouple and thermopile.

DESCRIPTION OF THE PREFERRED EMBODIMENT

Figure 1:
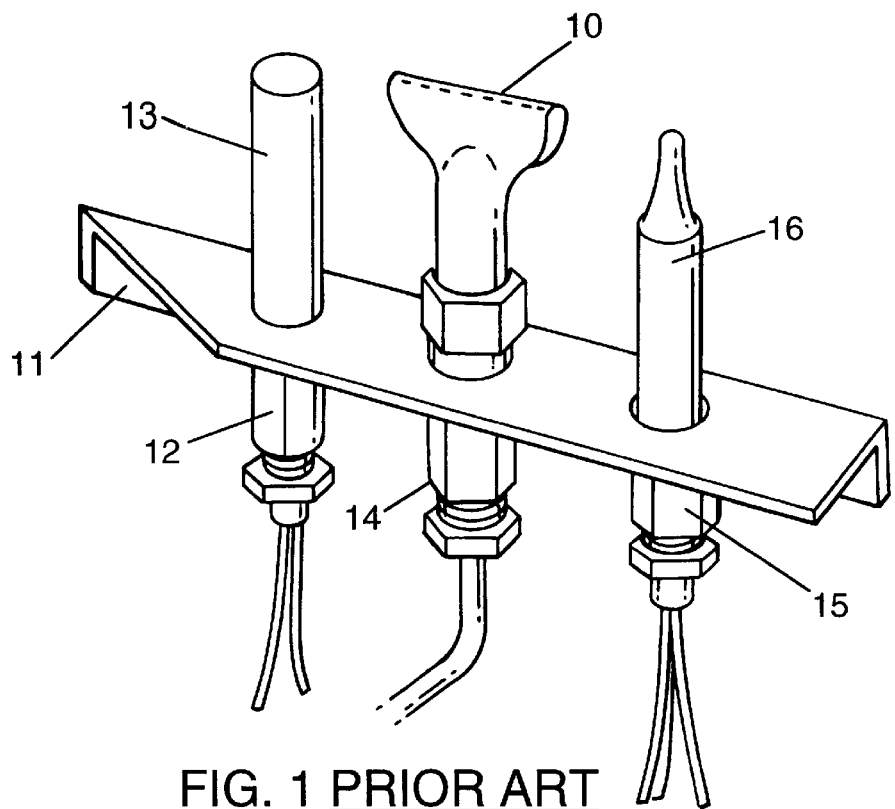
FIG. 1 is an isometric view of a typical pilot burner with associated thermocouple and thermopile.

FIG. 1 shows a typical exemplary pilot burner 10 carried by a bracket 11. Fittings for connecting the supply tube are designated at 14. Numeral 12 designates a support member carried by the bracket 11 which carries the thermopile 13. Numeral 15 designates a support member carried by the bracket 11 which carries the thermocouple 16.

Figure 2:
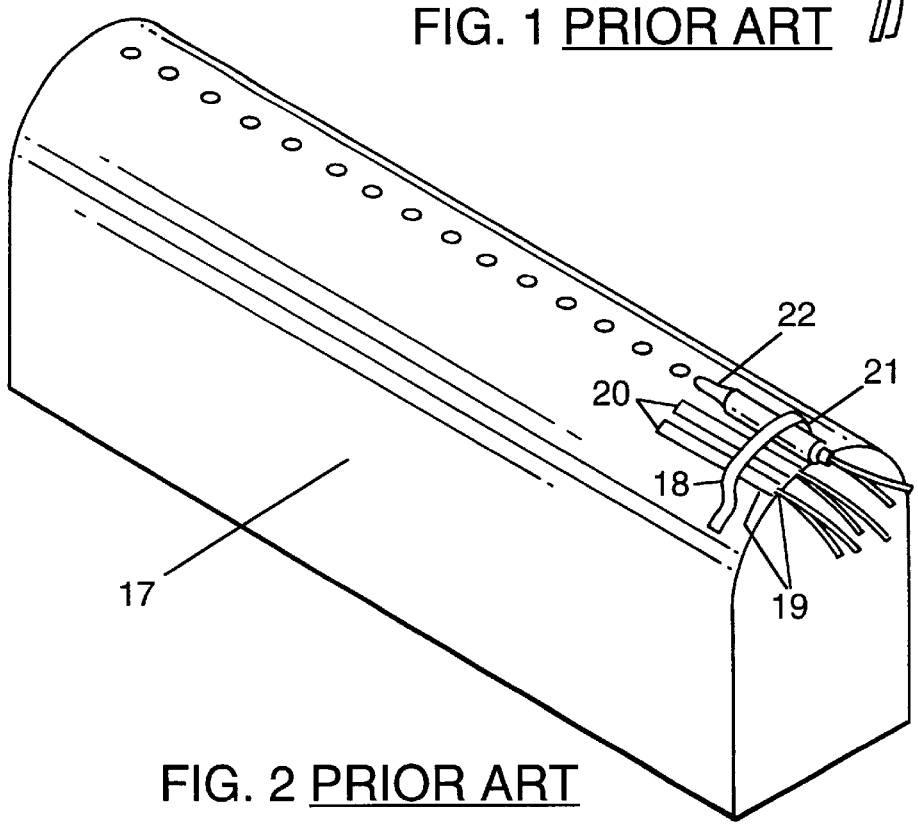
FIG. 2 is an isometric view of a typical gas burner with associated thermocouple and thermopile.

FIG. 2 shows a typical gas burner 17 with bracket 18 attached. Numeral 19 designates a support member carried by the bracket 18 which carries the thermopile 20. Numeral 21 designates a support member carried by bracket 18 which carries the thermocouple 22.

FIG. 3 shows an enlarged sectional view of the combined thermocouple and thermopile. The thermopile assembly is housed within metallic sleeve 23. The thermopile 24 is separated from the metallic sleeve 23 by insulator 25. The thermocouple assembly is comprised of tip 26 which is affixed to an insulated 27 constantan wire 28 at 43 and an insulated copper lead 29 which is affixed to a constantan wire 28 at 42 is centrally positioned within thermopile assembly. Thermopile leads 30 are affixed to the thermopile array at 41. Thermocouple lead 29 and thermopile leads 30 exit the assembly through strain relief 31 which is crimped to the sleeve 23 at 32. Wire leads 29 and 30 are crimped within strain relief 31 at 33 to prevent their dislocation in the event of excessive force on the leads and to maintain the relationship of the thermocouple assembly relative to the thermopile 24, insulation 25 and metallic sleeve 23. Thermocouple tip 26 is isolated from thermopile sleeve 23 by insulation 25 to prevent thermal and electrical conductance through the thermopile sleeve 23. Wire lead 34 is permanently affixed to thermocouple tip 26 to function as the cold junction and ground.

FIG. 4 is an isometric view of the preferred embodiment which shows thermocouple tip 26 which is isolated from thermopile sleeve 23 by insulation 25. Strain relief 31 is shown crimped 35 to thermopile sleeve 23. Thermopile wire leads 30 and thermocouple wire leads 29 are shown crimped within strain relief 31.

Figure 5:
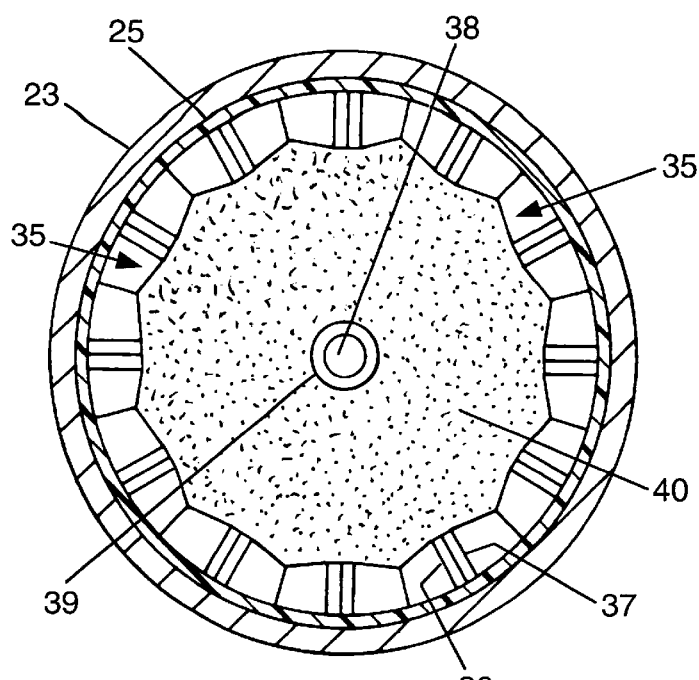
FIG. 5 is a sectional view taken along the line 5—5.

FIG. 5 is a sectional view 5—5 of the combined thermocouple and thermopile. The thermopile elements 35 consisting of two groups of dissimilar elements 36 and 37 joined at their ends to provide hot thermocouple and cold thermocouple junctions. The two groups of elements are arrayed circularly as illustrated. Insulation 25 separates the thermocouple array from the metallic sleeve 23. The insulated copper wire lead 38 of the thermocouple is centrally positioned and isolated from the thermopile by the wire lead insulation 39 and an insulating magnesium oxide material 40 shown in FIG. 3.

Figure 6:
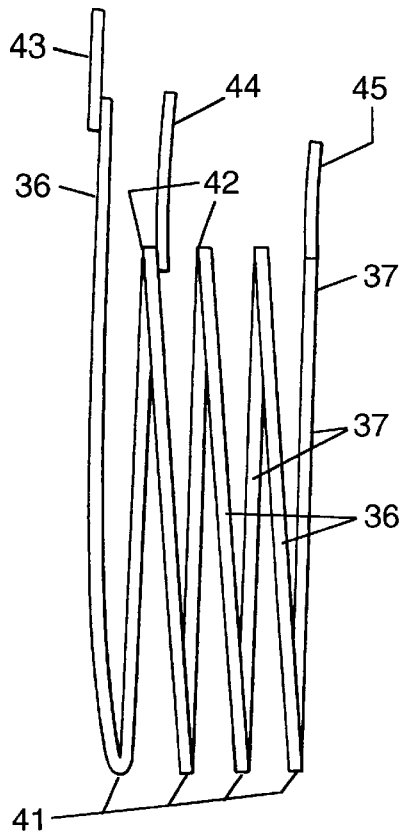
FIG. 6 is an exploded schematic view illustrating the thermopile elements and the wire extension leads used to tap multiple EMF signals.

FIG. 6 shows the assembly of the thermopile elements developed rather than being in a circular configuration. As may be seen element 36 is joined at one end to an element 37 forming a hot junction as designated by numeral 41. The element 36 is joined at its opposite end to the next adjacent element 37 forming a cold junction as designated at 42. The junctions are formed by spot welding the outer ends of the elements. The hot junctions are formed at one end and the cold junctions are formed at the opposite end. Numerals 43, and 45 designate the electrical terminal connections to the cold junctions which provide the maximum EMF signal from the thermopile. Numeral 44 designates an intermediate terminal connection to a cold junction which provides a second lesser value of EMF.

Figure 7:
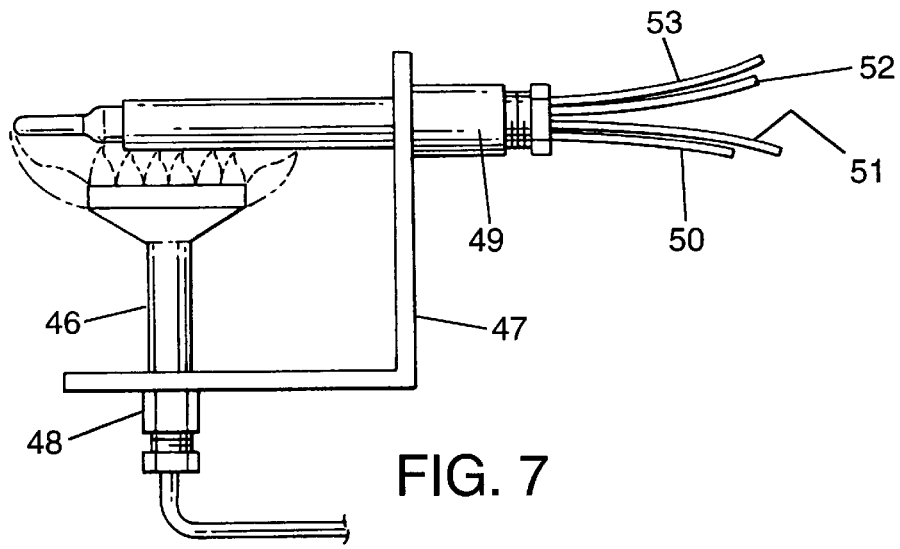
FIG. 7 is an isometric view of a typical pilot burner with the proposed embodiment attached.

FIG. 7 shows a typical pilot burner 46 carried by bracket 47. Fittings for connecting the supply tube are designated at 48. Numeral 49 designates a support member carried by the bracket 47 which carries the combined thermocouple and thermopile. Numerals 50, 51, 52, and 53 designate the combined thermocouple and thermopile leads exiting the preferred embodiment.

The thermopile configuration as described and shown is uniquely different from prior art constructions which as previously indicated typically utilize two electrical terminal connections to provide one EMF signal. The construction as shown is an improved design utilizing three terminals for providing two EMF signals.

The configuration as described and shown is uniquely different from prior art constructions which as previously indicated is comprised of a thermopile consisting of flat wires or bands constituting a radial design with welds between flat surfaces adjacent to ends of the flat wires; and a centrally located thermopile which consists of a nickel chrome or ferric chrome tip, an insulated constantan wire permanently connected to the tip and an insulated copper lead wire permanently connected to the constantan wire positioned longitudinally. The combined unit which has three electrical leads eminating from the strain relief is capable of providing two EMF signals. Where the thermopile has more than two electrical connections the combined thermopile is capable of providing three EMF signals. A combined unit of the type previously described is capable of operating three safety devices or remote controls.

What is claimed is:

1. A combined thermocouple and thermopile construction wherein the thermopile is housed within a metallic sleeve, conductors of the thermopile comprising dissimilar flat wire metals of equal lengths joined at their ends to provide an array of hot and cold thermocouple junctions having three wire conductor leads attached to three separate cold junctions to provide two EMF signals, and the thermopile is combined with a thermocouple assembly which is longitudinally positioned and centrally located within but isolated from the metallic sleeve and thermopile array providing a third EMF signal.

2. A combined thermocouple and thermopile construction as in claim 1, wherein two of the three wire conductor leads are attached to two of the cold junctions at either end of the array and the third is attached to an intermediate cold junction.

3. A combined thermocouple and thermopile construction as in claim 1, wherein the thermocouple construction comprises a tip, an insulated constantan wire permanently affixed to the tip and an insulated wire extension affixed to the constantan wire.

4. A combined thermocouple and thermopile construction as in claim 3, wherein the thermocouple tip is positioned within the metallic sleeve and is isolated from said sleeve by an insulator separating the thermopile from the metallic sleeve.

5. A combined thermocouple and thermopile construction as in claim 4, wherein said thermocouple tip is also isolated from said thermopile by maintaining a specified distance from said thermopile.

* * * * *